US012772817B2

(12) United States Patent
Honda

(10) Patent No.: US 12,772,817 B2
(45) Date of Patent: Oct. 20, 2026

(54) SEMICONDUCTOR DEVICE

(71) Applicant: Kioxia Corporation, Tokyo (JP)

(72) Inventor: Shingo Honda, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 384 days.

(21) Appl. No.: 18/456,623

(22) Filed: Aug. 28, 2023

(65) Prior Publication Data

US 2024/0096690 A1 Mar. 21, 2024

(30) Foreign Application Priority Data

Sep. 21, 2022 (JP) ................................ 2022-149903

(51) Int. Cl.

| | |
|---|---|
| ***H01L 21/768*** | (2006.01) |
| ***H01L 23/522*** | (2006.01) |
| ***H10B 69/00*** | (2023.01) |
| ***H10W 20/00*** | (2026.01) |
| ***H10W 20/42*** | (2026.01) |

(52) U.S. Cl.

CPC .......... *H10W 20/082* (2026.01); *H10B 69/00* (2023.02); *H10W 20/42* (2026.01)

(58) Field of Classification Search

CPC ............. H01L 21/76804; H01L 21/768; H01L 21/76805; H01L 21/76816; H01L 23/5226; H01L 23/522; H01L 23/528; H10B 43/10; H10B 43/50; H10B 43/27; H10B 41/00; H10B 41/20; H10B 63/00; H10B 63/22; H10B 63/20; H10B 69/00; H10B 41/70; H10B 41/27; H10B 43/00; G06F 30/00; H10W 20/082; H10W 20/00; H10W 20/42; H10W 20/089; H10W 20/083

See application file for complete search history.

(56) References Cited

U.S. PATENT DOCUMENTS

| | | | | |
|---|---|---|---|---|
| 6,503,829 B2 | 1/2003 | Kim et al. | | |
| 9,209,123 B2 * | 12/2015 | Kuwajima | ........ | H01L 21/76877 |
| 9,627,400 B2 | 4/2017 | Koshiishi et al. | | |
| 9,704,923 B1 * | 7/2017 | Bernhardt | ......... | H01L 21/76877 |
| 2015/0108655 A1 * | 4/2015 | Kuwajima | ........ | H01L 23/49827 257/774 |
| 2016/0056070 A1 * | 2/2016 | Kuwajima | ........ | H01L 21/76831 438/618 |
| 2016/0240547 A1 * | 8/2016 | Tagami | .................. | H10B 43/27 |
| 2017/0186815 A1 * | 6/2017 | Bernhardt | ........... | H01L 23/5226 |
| 2019/0267393 A1 * | 8/2019 | Aoyama | ................ | H10B 43/27 |
| 2021/0082949 A1 * | 3/2021 | Harada | ............. | H01L 21/76898 |
| 2021/0249434 A1 * | 8/2021 | Nishikawa | ............. | H10B 43/35 |

FOREIGN PATENT DOCUMENTS

| | | |
|---|---|---|
| JP | H04-003961 A | 1/1992 |
| JP | 5031956 B2 | 9/2012 |
| JP | 6226788 B2 | 11/2017 |

* cited by examiner

*Primary Examiner* — Nikolay K Yushin

(74) *Attorney, Agent, or Firm* — Foley & Lardner LLP

(57) ABSTRACT

A semiconductor device includes a first layer including a first recess portion on an upper surface; and a second recess portion that extends from a bottom surface of the first recess portion in the first layer, and the second recess portion has a tapered shape in which a width in a first direction along a surface direction of the first layer reduces from the bottom surface of the first recess portion in a depth direction of the first layer.

7 Claims, 10 Drawing Sheets

SEMICONDUCTOR DEVICE

CROSS-REFERENCE TO RELATED APPLICATION

This application is based upon and claims the benefit of priority from Japanese Patent Application No. 2022-149903, filed Sep. 21, 2022, the entire contents of which are incorporated herein by reference.

FIELD

Embodiments described herein relate generally to a semiconductor device and a method of manufacturing a semiconductor device.

BACKGROUND

As an aspect ratio increases, there is a tendency to become more difficult to embed a pattern with a predetermined film. Due to this, unintended seams and voids are formed so that product failure occurs.

DETAILED DESCRIPTION

Embodiments provide a semiconductor device and a method of manufacturing a semiconductor device that can prevent embedding failure.

In general, according to at least one embodiment, a semiconductor device includes a first layer including a first recess portion on an upper surface; and a second recess portion that extends from a bottom surface of the first recess portion in the first layer, and the second recess portion has a tapered shape in which a width in a first direction along a surface direction of the first layer reduces from the bottom surface of the first recess portion in a depth direction of the first layer.

Hereinafter, embodiments of the present disclosure are described with reference to the drawings. In addition, the present disclosure is not limited by the following embodiments. In addition, components in the following embodiments include those that can be easily assumed by those skilled in the art or substantially the same components.

Embodiment 1

Embodiment 1 is described in detail below with reference to the drawings.

(Configuration Example of Semiconductor Device)

Figure 1A:
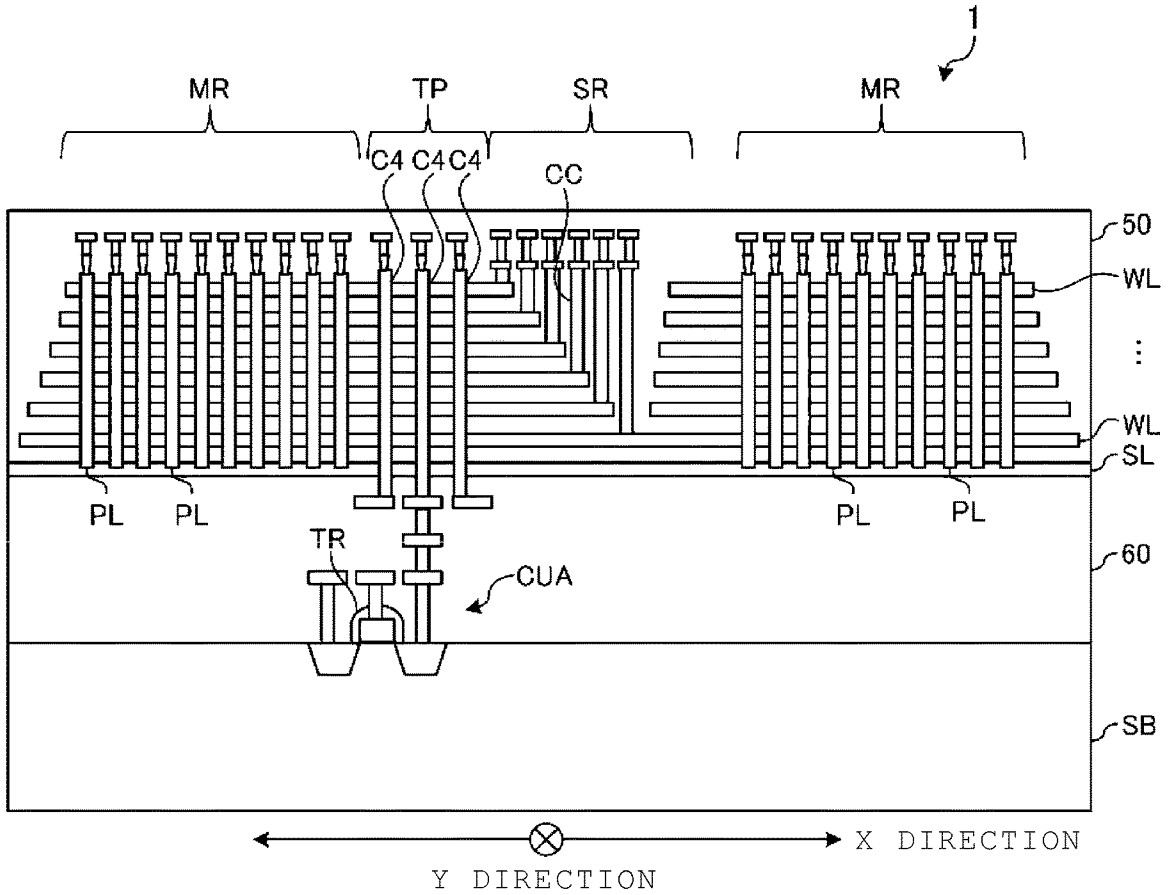
FIGS. 1A and 1B are diagrams schematically illustrating a configuration example of a semiconductor device related to Embodiment 1.
Figure 1B:
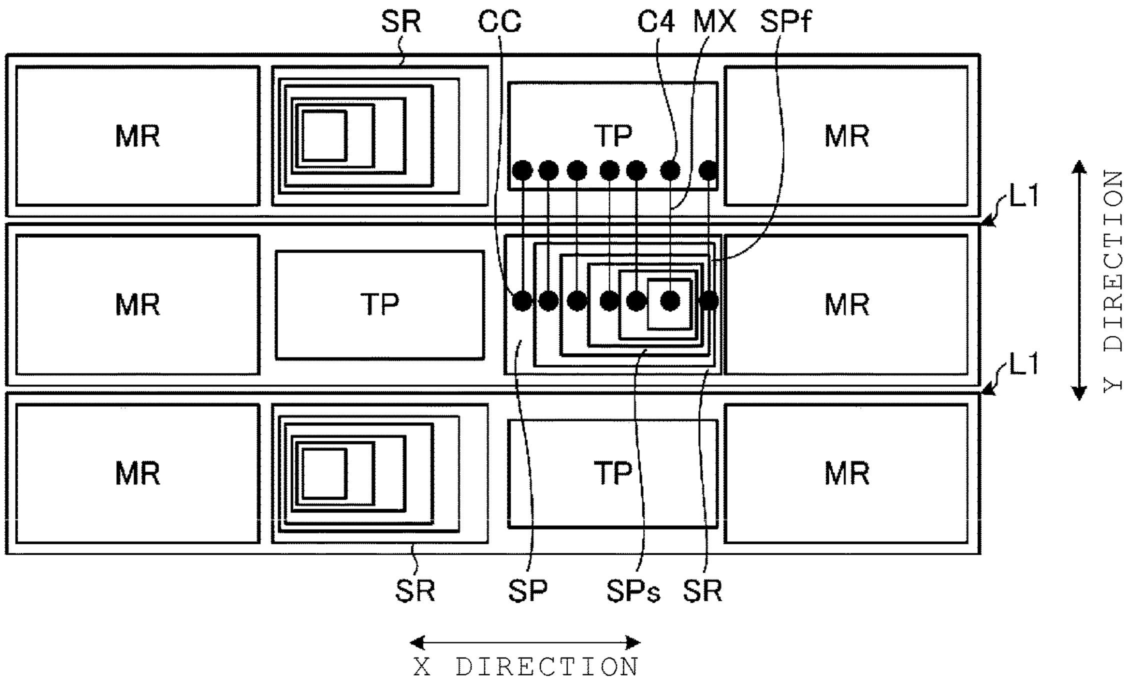

FIGS. 1A and 1B are diagrams schematically illustrating a configuration example of a semiconductor device 1 related to the embodiment. FIG. 1A is a cross-sectional view of the semiconductor device 1 in an X direction, and FIG. 1B is a schematic plan view illustrating a layout of the semiconductor device 1. Incidentally, in FIG. 1A, hatching is omitted in consideration of the visibility of the drawing. Also, in FIG. 1A, a portion of upper layer wiring is omitted.

In this specification, both the X direction and the Y direction are directions along a plane of a word lines WL described below, and the X direction and the Y direction are orthogonal to each other.

As illustrated in FIGS. 1A and 1B, the semiconductor device 1 includes a peripheral circuit CUA, a memory region MR, a through contact region TP, and a step region SR on a substrate SB.

The substrate SB is, for example, a semiconductor substrate such as a silicon substrate. The peripheral circuit CUA including a transistors TR, wiring, and the like is disposed on the substrate SB. The peripheral circuit CUA contributes to an operation of a memory cell described below.

The peripheral circuit CUA is covered with an insulating layer 60. A source line SL is disposed on the insulating layer 60. The plurality of word lines WL are stacked on the source line SL. The plurality of word lines WL are covered with an insulating layer 50. The insulating layer 50 expands around the plurality of word lines WL.

A plurality of plate-shaped contacts LI that penetrate the word lines WL in a stacking direction and extend in a direction along the X direction are located in the plurality of word lines WL. Therefore, the plurality of word lines WL are divided by the plurality of plate-shaped contacts LI in the Y direction.

The plurality of memory regions MR, the step region SR, and the through contact region TP are located between the plurality of plate-shaped contacts LI in the X direction side by side. The plurality of memory regions MR are separated from each other in the X direction with the step region SR and the through contact region TP interposed therebetween.

A plurality of pillars PL penetrating the word lines WL in the stacking direction are located in the memory region MR. In intersections between the pillars PL and the word lines WL, a plurality of memory cells are formed. Therefore, the semiconductor device 1 is configured, for example, as a three-dimensional nonvolatile memory in which memory cells are three dimensionally located in the memory region MR.

The step region SR includes step portions SP in which a plurality of word lines WL are dug down in a mortar shape in the stacking direction.

The step portion SP forms one side in a mortar shape that descends stepwise from both sides in the X direction and one side in the Y direction toward the bottom surface.

Each step of the step portions SP is configured with the word line WL in each hierarchical level. The word line WL in each hierarchical level maintains electrical connection on both sides in the X direction via the step portion SP with the step regions SR interposed therebetween. A contact CC for connecting the word line WL in each hierarchical level and upper layer wiring MX is located in a terrace portion on each step of the step portion SP.

As a result, the word lines WL stacked in multiple layers can be drawn out individually. From these contacts CC, write voltages, read voltages, and the like are applied to memory cells in the memory regions MR on both sides in the X direction via word lines WL at the same height position as the memory cells.

In this specification, the direction in which the terrace surface of each step of the step portion SP faces is defined as an upward direction.

The through contact region TP is disposed on one side of the step region SR in the X direction. A through contact C4 penetrating the plurality of word lines WL is disposed in the through contact region TP. The through contact C4 connects the peripheral circuit CUA disposed on the lower substrate SB and the upper layer wiring MX connected to the contact CC of the step portion SP. Various voltages applied from the contact CC to the memory cell is controlled by the peripheral circuit CUA via the through contact C4, the upper layer wiring MX, and the like.

Figure 2A:
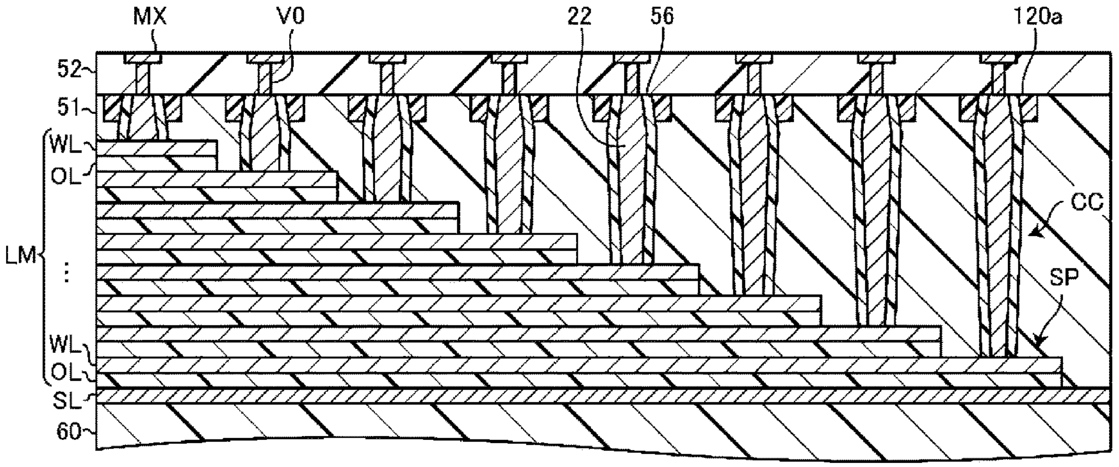
FIGS. 2A to 2C are cross-sectional views illustrating an example of a configuration of a semiconductor device related to Embodiment 1.
Figure 2B:
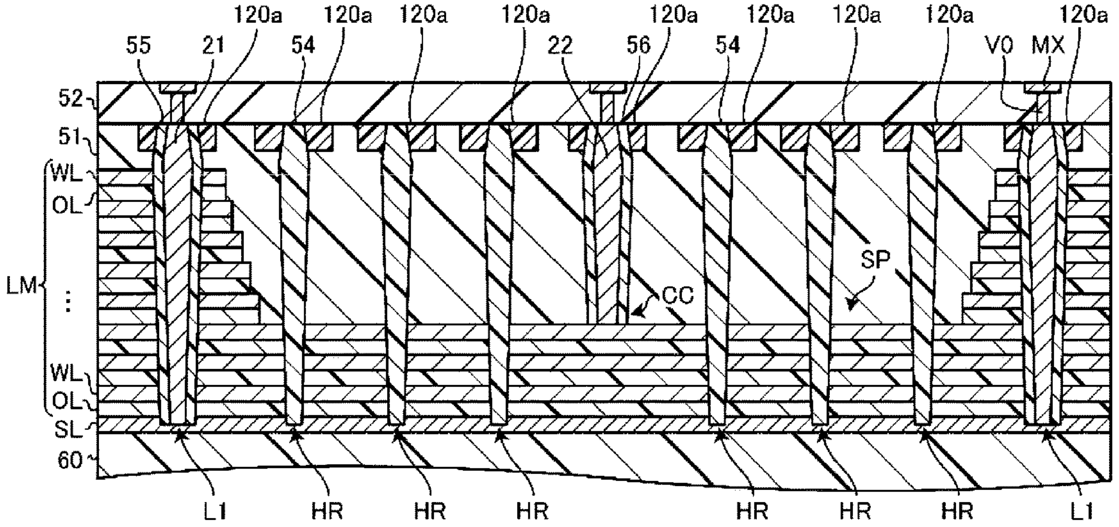

Next, a specific configuration example of the semiconductor device 1 is described by using FIGS. 2A and 2B.

Figure 2C:
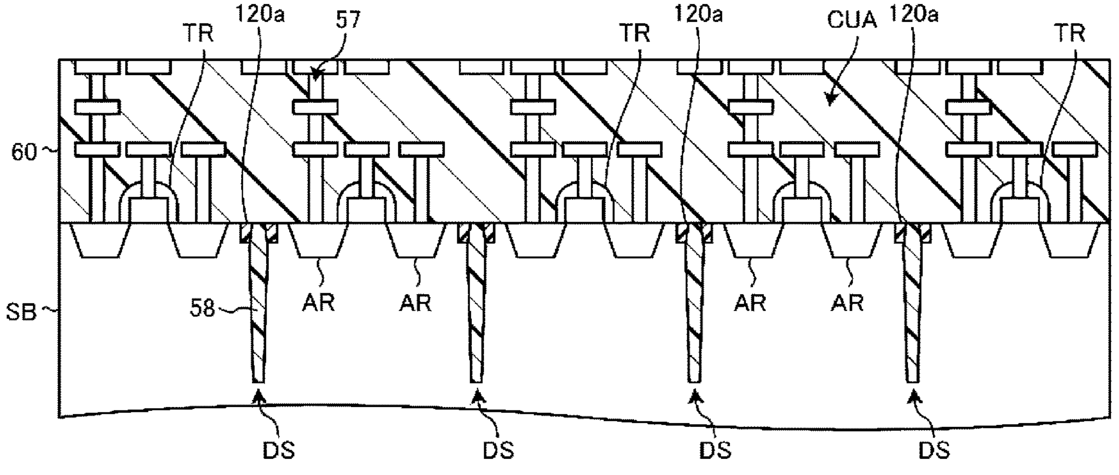

FIGS. 2A and 2B are cross-sectional views illustrating an example of a configuration of the semiconductor device 1 related to Embodiment 1. FIG. 2A is a cross-sectional view illustrating the step region SR in the X direction. FIG. 2B is a cross-sectional view illustrating the step region SR in the Y direction. FIG. 2C is a cross-sectional view illustrating the peripheral circuit CUA.

As illustrated in FIGS. 2A and 2B, the semiconductor device 1 includes the peripheral circuit CUA provided on the substrate SB, the source line SL located above the peripheral circuit CUA, and a stacked body LM having the pillars PL (see FIGS. 1A and 1B), the contacts CC, the plate-shaped contacts LI, a columnar portion HR, and the like located above the source line SL.

As illustrated in FIG. 2C, the peripheral circuit CUA includes transistors TR, active areas AR, wiring 57, and element dividing sections DS.

The active areas AR are regions where impurities are diffused on the substrate SB and function as sources or drains of the transistors TR. The active areas AR are connected to the through contacts C4 illustrated in FIGS. 1A and 1B via the wiring 57 including vias penetrating the insulating layer 60 in the vertical direction.

The element dividing section DS has a configuration in which a groove provided in the substrate SB is filled with an insulating layer 58 such as an oxide silicon layer. The element dividing sections DS extend along the surface of the substrate SB and are located side by side at a predetermined interval in a direction intersecting the extending direction each other. Accordingly, the respective active areas AR are electrically separated.

The peripheral circuit CUA having the above configuration is covered, for example, with the insulating layer 60 such as an oxide silicon layer.

The source line SL is, for example, a conductive polysilicon layer.

The stacked body LM is located on the source line SL. The plurality of word lines WL and a plurality of insulating layers OL are alternately stacked one by one in the stacked body LM. The stacking number of the word lines WL in the stacked body LM is freely set.

The word lines WL as a plurality of conductive layers are, for example, tungsten layers or molybdenum layers. The plurality of insulating layers OL are, for example, oxide silicon layers.

The upper surface of the stacked body LM is covered with an insulating layer 52, and the insulating layer 52 configures a portion of the insulating layer 50 illustrated in FIG. 1A together with an insulating layer 51 described below.

As illustrated in FIG. 2B, the stacked body LM is divided by the plurality of plate-shaped contacts LI in the Y direction.

The plate-shaped contacts LI are located side by side in the Y direction and extend in directions along the stacking direction of the stacked body LM and the X direction. That is, the plate-shaped contacts LI penetrate the insulating layers 52 and 51 and the stacked body LM and reach the source line SL. Also, the plate-shaped contacts LI continuously extend in the stacked body LM from one end portion to the other end portion of the stacked body LM in the X direction.

In addition, the plate-shaped contacts LI each include an insulating layer 55 and a conductive layer 21. The insulating layer 55 is, for example, an oxide silicon layer. The conductive layer 21 is, for example, a tungsten layer or a conductive polysilicon layer.

The insulating layer 55 covers side walls of the plate-shaped contacts LI in the Y direction. The conductive layer 21 fills the inside of the insulating layer 55 and is electrically connected to the source line SL. In addition, the conductive layer 21 is connected to the upper layer wiring MX via a plug V0 located in the insulating layer 52. In such a configuration, the plate-shaped contacts LI function as source line contacts.

However, instead of the plate-shaped contacts LI, a plate-shaped portion filled with an insulating layer may divide the stacked body LM in the Y direction by penetrating the stacked body LM and extending in a direction along the X direction. In this case, such a plate-shaped portion does not have a function as a source line contact.

As illustrated in FIGS. 2A and 2B, the step portions SP are located in the step region SR. The step portion SP has a shape in which the plurality of word lines WL and the plurality of insulating layers OL are processed in a step shape. In addition, the step portions SP stepwise descend toward a direction of coming close to the memory region MR. The step portions SP have a function of electrically drawing out the plurality of word lines WL to the upper layer wiring MX.

The insulating layer 51 such as the oxide silicon layer is located in the step region SR to cover the upper surface of the step portion SP. The insulating layer 52 described above also covers the upper surface of the insulating layer 51.

The contacts CC penetrating the insulating layers 52 and 51 are connected to the word lines WL that configure each step of the step portion SP.

The contact CC includes an insulating layer 56 that covers an outer circumference of the contact CC and a conductive layer 22 such as a tungsten layer or a copper layer that fills the inside of the insulating layer 56. The conductive layer 22 is connected to the upper layer wiring MX via the plug V0 located in the insulating layer 52. This upper layer wiring MX is connected to the through contact C4 of the through contact region TP adjacent in the Y direction, for example, via the plate-shaped contacts LI as described above.

In such a configuration, the word line WL of each layer can be electrically drawn out. That is, in the above configuration, a predetermined voltage is applied to a memory cell formed in the pillars PL (see FIGS. 1A and 1B) described above from the peripheral circuit CUA via the through contact C4, the contacts CC, the word lines WL, and the like and can operate the memory cell as a storage element.

Here, FIG. 2B illustrates a third cross section from the lowest step of the step portion SP. That is, FIG. 2B illustrates a portion in which the third word line WL from the word line WL of the lowest layer becomes a terrace surface.

The plurality of columnar portions HR that penetrate the insulating layer 51 and the stacked body LM and reach the step region SR are located on the source line SL in a dispersed manner.

The plurality of columnar portions HR are located in a zigzag or a grid shape while avoiding interference with the contacts CC and the plate-shaped contacts LI. The columnar portions HR each have, for example, a circular shape, an oval shape, or an elliptical shape as a cross-sectional shape along the XY plane.

The plurality of columnar portions HR each have, for example, a configuration in which an insulating layer 54 fills in the hole penetrating the insulating layer 51 and the stacked body LM and does not contribute to the function of the semiconductor device 1. In a step of manufacturing the semiconductor device 1, the columnar portion HR has a role of supporting such a configuration when the stacked body LM is formed with a stacked body obtained by stacking sacrifice layers and insulating layers.

Meanwhile, the plate-shaped contacts LI, the contacts CC, the columnar portion HR, and the element dividing sections DS described above each have a bowing shape near an upper end portion. The bowing shape refers to a shape in which a width or a diameter becomes maximum between the upper end portion and the lower end portion. In addition, auxiliary layers 120*a* are provided with a predetermined depth around the upper end portions of the plate-shaped contacts LI, the contacts CC, the columnar portion HR, and the element dividing sections DS.

The auxiliary layers 120*a* surround each of the plate-shaped contacts LI, the contacts CC, the columnar portion HR, and the element dividing sections DS and are formed to a depth on the upper side of a position where a width or a diameter of each portion having a bowing shape becomes maximum.

The auxiliary layer 120*a* is, for example, LP-TEOS formed by low pressure-chemical vapor deposition (LP-CVD) and P-dTEOS formed by plasma CVD. In addition, as the auxiliary layer 120*a*, P—SiN, Poly-Si, and the like may be used. At least any one of these is used as the auxiliary layer 120*a*.

Specifically, for example, when a formation target of the auxiliary layer 120*a* is the contact CC, the auxiliary layer 120*a* further surrounds an outer circumference of the insulating layer 56 that surrounds the outer circumference portion of the contact CC and is formed, for example, in a rectangular shape, when viewed from the above.

In addition, for example, when the formation target of the auxiliary layer 120*a* is the columnar portion HR, the auxiliary layer 120*a* surrounds the outer circumference of the insulating layer 54 of the columnar portion HR and is formed, for example, in a rectangular shape when viewed from the above.

Meanwhile, for example, when the formation target of the auxiliary layer 120*a* is the plate-shaped contact LI, the auxiliary layer 120*a* surrounds the plate-shaped contact LI along the side wall of the insulating layer 55 of the plate-shaped contact LI extending in the Y direction and is formed, for example, in a rectangular shape having a long side in the Y direction, when viewed from the above.

In addition, for example, when the formation target of the auxiliary layer 120*a* is the element dividing section DS, the auxiliary layer 120*a* surrounds the insulating layer 58 along the side wall of the insulating layer 58 of the element dividing section DS extending in the X direction and is formed, for example, in the rectangular shape having the long side in the extending direction of the element dividing section DS when viewed from the above.

(Method of Manufacturing Semiconductor Device)

Next, by using FIGS. 3A to 3F, a method of manufacturing the semiconductor device 1 according to Embodiment 1 is described. FIGS. 3A to 3F are diagrams illustrating a portion of a procedure of the method of manufacturing the semiconductor device 1 related to Embodiment 1.

In the example of FIGS. 3A to 3F, an example of performing an etching process in which a layer to be processed 100 as a first layer is used as a process target is described as a step of the method of manufacturing the semiconductor device 1.

Here, the layer to be processed 100 is a layer to be a process target when the plate-shaped contacts LI, the contacts CC, the columnar portion HR, and the element dividing sections DS are formed, which is an example of an application target in the present step. For example, when the contact CC is formed, the layer to be processed 100 is the insulating layer 51 described above. In addition, for example, when the plate-shaped contacts LI and the columnar portion HR are formed, the layer to be processed 100 is a stacked body before the insulating layer 51 and the word lines WL are formed. Also, when the element dividing section DS is formed, the layer to be processed 100 is the substrate SB.

FIGS. 3A to 3F are cross-sectional views illustrating the layer to be processed 100.

Figure 3A:
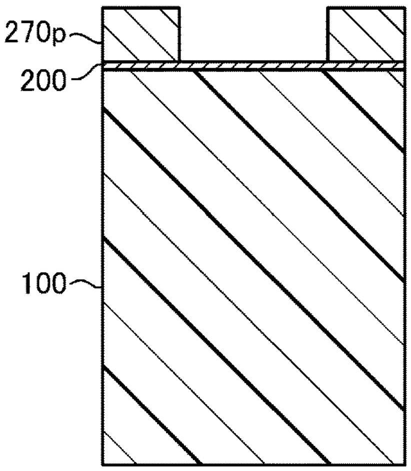
FIGS. 3A to 3F are diagrams illustrating a portion of a procedure of a method of manufacturing a semiconductor device related to Embodiment 1.

As illustrated in FIG. 3A, a bottom anti-reflection coating (BARC) layer 200, and a resist layer (not illustrated) are formed on the upper surface of the layer to be processed 100, and a resist pattern 270*p* is formed by performing exposure and development processes. Also, the BARC layer 200 and the resist pattern 270*p* are organic films that can be, for example, formed by a spin coating method and can be removed by asking.

Figure 3D:
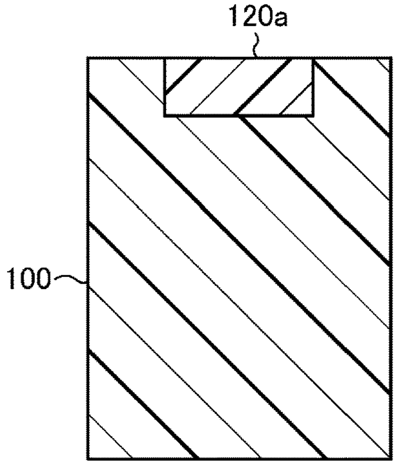
Figure 3B:
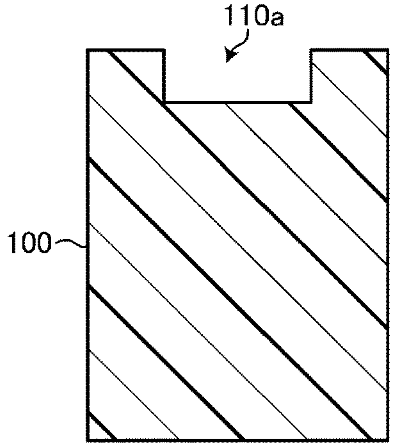

As illustrated in FIG. 3B, after the BARC layer 200 is removed by using the resist pattern 270*p* as a mask, the layer to be processed 100 is further etched to remove the resist pattern 270*p* and the BARC layer 200 that remain on the upper surface of the layer to be processed 100 by ashing or the like. Accordingly, a recess 110*a* is formed as a first recess portion.

At this time, for example, a method by plasma etching such as reactive ion etching (RIE) or the like is used as the etching. After performing ashing on the resist pattern 270*p* and the BARC layer 200, an SH process or the like may be performed.

Figure 3E:
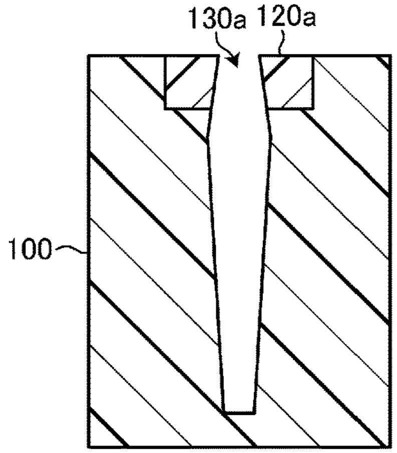
Figure 3C:
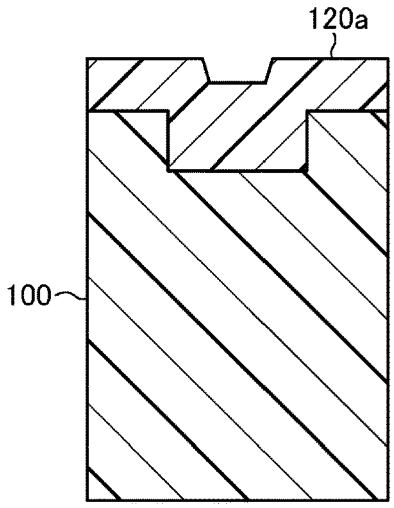

As illustrated in FIG. 3C, the auxiliary layer 120*a* that covers the upper surface of the layer to be processed 100 including the recess 110*a* is formed. At this time, at least any one of LP-TEOS, P-dTEOS, P—SiN, Poly-Si, and the like may be used as the auxiliary layer 120*a* as described above. The material used for the auxiliary layer 120*a* may be determined according to the type of the layer to be processed 100 provided with the recess 110*a*.

Specifically, for example, a material having lower resistance to plasma etching such as RIE than the material of the layer to be processed 100 is selected for the auxiliary layers 120*a*. That is, a material that has a higher etching rate and is easier to etch than the material of the layer to be processed 100 may be used as the material of the auxiliary layer 120*a*.

As illustrated in FIG. 3D, the auxiliary layer 120*a* that is formed on the upper surface of the layer to be processed 100 is removed by a method such as chemical mechanical polishing (CMP). Accordingly, the auxiliary layer 120*a* that exposes the upper surface of the layer to be processed 100 and fills the recess 110*a* is formed.

As illustrated in FIG. 3E, an embedding target portion 130*a* as a second recess portion is formed on the layer to be processed 100 on which the auxiliary layer 120*a* is formed as described above.

More specifically, a BARC layer and a resist layer (not illustrated) are formed on the upper surface of the layer to be processed 100, and a resist pattern (not illustrated) having a predetermined pattern in the region where the auxiliary layer 120*a* is formed when viewed from the above is formed. After the BARC layer 200 is removed, the auxiliary layer 120*a* and the layer to be processed 100 are etched by using the resist pattern as a mask to remove the resist pattern and the BARC layer by ashing. Accordingly, the embedding target portion 130*a* is formed.

At this time, after ashing the resist pattern and the BARC layer, the SH process or the like may be performed.

Here, the embedding target portion 130*a* has, for example, a shape different from the application targets of the present step such as the plate-shaped contact LI, the contact CC, the columnar portion HR, and the element dividing section DS. For example, when the contacts CC and the columnar portion HR are the application targets, the embedding target portion 130*a* has a hole shape in which the layer to be processed 100 extends in the vertical direction. In addition, for example, when the plate-shaped contact LI and the element dividing section DS are formed, the embedding target portion 130*a* has a groove shape extending in the paper depth direction.

As described above, in order to make the shape of the embedding target portion 130*a* different according to the application target, a predetermined pattern to be formed in the formation region of the auxiliary layer 120*a* may be set as a hole shape, a groove shape, and the like.

Figure 3F:
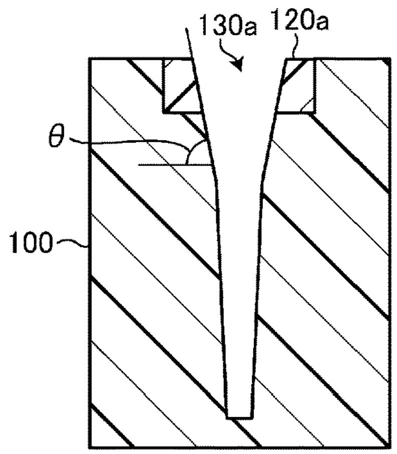

In FIG. 3F, the entire upper surfaces of the layer to be processed 100 and the auxiliary layers 120*a* are etched back. Accordingly, the embedding target portion 130*a* is processed into a forwardly tapered shape in which the upper end is enlarged in the XY direction, and a width and a diameter decrease from the enlarged upper end to the downward direction. As described above, the auxiliary layer 120*a* formed on the upper portion of the embedding target portion 130*a* is more easily etched than the layer to be processed 100, and thus a forwardly tapered shape of the upper portion of the embedding target portion 130*a* can be easily obtained.

Here, an angle formed by a tapered portion with respect to the plane along the XY directions is defined as a taper angle θ.

Here, when the upper surface of the layer to be processed 100 is etched back, etching deposits such as carbon polymer may be deposited on the upper surface of the layer to be processed 100. Since the etching of the upper surface of the layer to be processed 100 is prevented, the upper end of the embedding target portion 130*a* can be enlarged without changing the thickness of the layer to be processed 100 in the height direction.

Next, in FIG. 3F, a predetermined film (not illustrated) is formed so that the upper surface of the layer to be processed 100 in which the embedding target portion 130*a* having the enlarged upper end is formed is covered. Accordingly, the predetermined film fills in the embedding target portion 130*a*.

Here, for example, a material of a predetermined film varies according to the application target of the present step such as the plate-shaped contact LI, the contact CC, the columnar portion HR, and the element dividing section DS. For example, when the contacts CC are formed, the predetermined films are the insulating layer 56 and the conductive layer 22. For example, when the columnar portion HR is formed, the predetermined film is the insulating layer 54. In addition, for example, when the plate-shaped contact LI is formed, the predetermined films are the insulating layer 55 and the conductive layer 21. Also, when the element dividing section DS is formed, the predetermined film is the insulating layer 58.

The semiconductor device 1 according to the embodiment is manufactured by flattening the upper surface of the layer to be processed 100 of which the predetermined film is formed by CMP and then repeating the formation of various films and processes of these films using photolithography technology and etching technology.

(Overview)

If the stacking number of the stacked body of the semiconductor device is increased, aspect ratios of patterns of a plate-shaped contact, a contact connected to a word line, a columnar portion supporting a stacked body, and the like may be increased. Also, due to the increase of the stacking number of the stacked body, the number of the memory cells formed in the stacked body also increases, and the number of transistors in the peripheral circuit increases. Accordingly, the density of the transistors in the peripheral circuit increases, and the element dividing sections have to be located densely in a narrow area, so that the aspect ratio of the element dividing section tends to also increase. For example, when the predetermined film is embedded in the pattern as described above having the bowing shape, before the inside of the pattern is filled with the predetermined film, the upper end of the pattern is blocked by the predetermined film to obstruct the embedding of the inside the pattern, so that cavities or the like may be formed in the pattern.

In this manner, if the predetermined film that is a filling material has cavities in the pattern, a stress may be caused in the predetermined film or in configurations in the periphery thereof. Due to such a stress, for example, a positional deviation may occur when various configurations are further formed on the stacked body, inclination may be formed in the pattern in which the predetermined film is embedded or in configurations in the periphery thereof, or warpage may occur in the substrate SB. Also, the embedded predetermined film may be peeled off due to tensile stress, to cause a decrease in the yield of the semiconductor device.

In order to resolve such an embedding failure, for example, a step of opening a blocked portion by etching the pattern in which the embedding failure occurs again and forming the predetermined film again has been repeated.

However, since the step including etching is repeated, not only the blocked upper end of the pattern or the like but also a region to which etching is not required, such as a region in which a pattern is not formed, may be damaged. In addition, due to the increase in the number of steps, a processing cost increases, and a time cost required for constructing such a complicated process also increases.

In the semiconductor device 1 according to Embodiment 1, by including the auxiliary layers 120*a* having a low etching resistance that fill the recess 110*a* of the upper surface of the layer to be processed 100, the embedding target portion 130*a* has a forwardly tapered shape in which a width and a diameter in the XY direction decrease toward the depth direction of the layer to be processed 100. Accordingly, an embedding failure in a pattern having a high aspect is prevented, so that the predetermined film can be easily filled.

(Modification 1)

Next, by using FIGS. 4A to 4D, the semiconductor device according to Modification 1 of Embodiment 1 is described. The semiconductor device according to Modification 1 is different from Embodiment 1 described above in that auxiliary layers are shared between the plurality of contacts CC, between the plurality of columnar portions HR, and with the plate-shaped contacts LI.

Figure 4A:
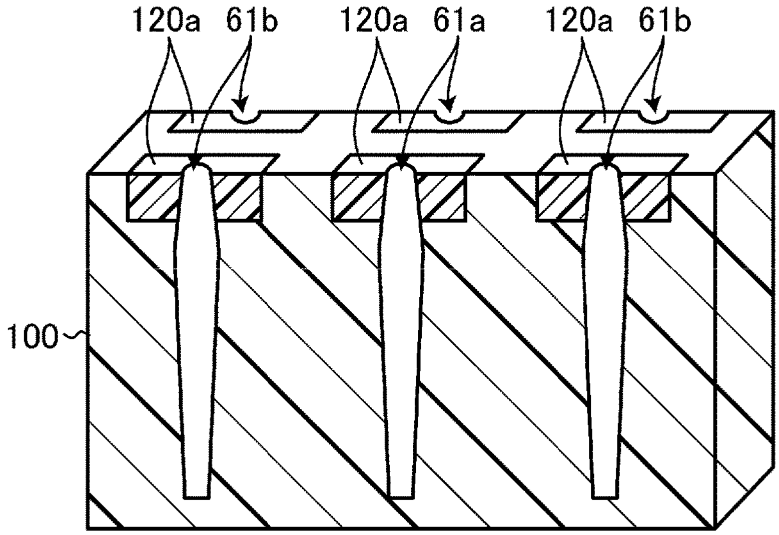
FIGS. 4A to 4D are diagrams illustrating a portion of a procedure of a method of manufacturing a semiconductor device related to Modification 1 of Embodiment 1.
Figure 4B:
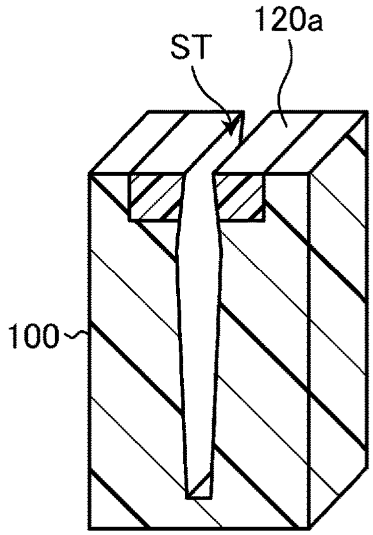
Figure 4C:
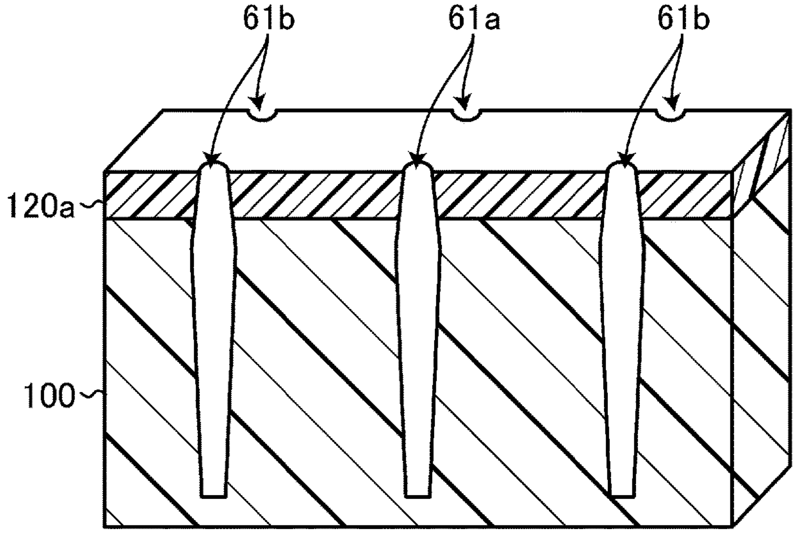
Figure 4D:
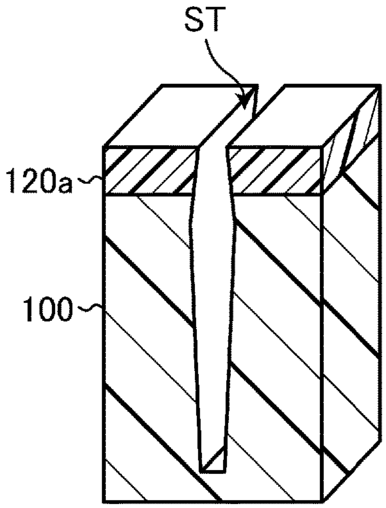

FIGS. 4A to 4D are diagrams illustrating a portion of the procedure of a method of manufacturing the semiconductor device related to Modification 1 of Embodiment 1. FIGS. 4A and 4B illustrate an example of a case where the auxiliary layers 120*a* such as the plurality of contacts CC, the plurality of columnar portions HR, and the plate-shaped contacts LI are provided, similarly to Embodiment 1 as described above. FIGS. 4C and 4D illustrate an example of a case where an auxiliary layer is shared between the plurality of contacts CC, between the plurality of columnar portions HR, and with the plate-shaped contacts LI.

In order to obtain the configuration illustrated in FIGS. 4A and 4B, prior to the steps of FIGS. 4A and 4B, also in Modification 1, processes of FIGS. 3A to 3D according to Embodiment 1 described above are performed.

As illustrated in FIGS. 4A and 4B, the respective auxiliary layers 120*a* are independently formed for each different embedding target portion 130*a* in the upper portion of the layer to be processed 100. Specifically, for example, the auxiliary layers 120*a* are formed for each of holes 61*a* for forming the contacts CC, holes 61*b* for forming the columnar portions HR, and a groove ST for forming the plate-shaped contact LI.

Meanwhile, in the example illustrated in FIGS. 4C and 4D, the plurality of embedding target portions 130*a* are formed in the regions of the auxiliary layers 120*a* having a predetermined width which are formed in the upper portion of the layer to be processed 100. Specifically, for example, a hole 60*a*, a hole 60*b*, and the groove ST are formed in the same regions of the auxiliary layers 120*a*. That is, one auxiliary layer 120*a* is shared between the hole 60*a*, the hole 60*b*, and the groove ST.

In addition, FIGS. 4A to 4D illustrate that the hole 60*a*, the hole 60*b*, and the groove ST are collectively formed, but the illustration does not mean that such configurations are actually formed collectively. For example, the columnar portion HR, the contacts CC, the plate-shaped contacts LI, and the like may not be performed at the same time.

The process of FIG. 3F according to Embodiment 1 described above is performed on the layer to be processed 100 on which the embedding target portion 130*a* is formed.

The semiconductor device according to Modification 1 includes auxiliary layers that are shared between a plurality of configurations. By using such auxiliary layers, it is not necessary to precisely dispose recess portions for forming the auxiliary layers to individual configurations and it is possible to obtain a configuration including the auxiliary layers more simply.

In the semiconductor device according to Modification 1, the same effect as in the method of manufacturing the semiconductor device 1 according to Embodiment 1 described above is also exhibited.

(Modification 2)

Next, by using FIGS. 5A to 5F, the semiconductor device according to Modification 2 of Embodiment 1 is described. The semiconductor device according to Modification 2 is different from Embodiment 1 described above in that the auxiliary layers 120*a* to 120*c* configured with different types of materials for each configuration to be an application target of the method of Modification 2 such as the plurality of contacts CC, the plurality of columnar portions HR, and the plate-shaped contacts LI are formed.

FIGS. 5A to 5F are diagrams illustrating a portion of a procedure of a method of manufacturing the semiconductor device related to Modification 2 of Embodiment 1.

Figure 5A:
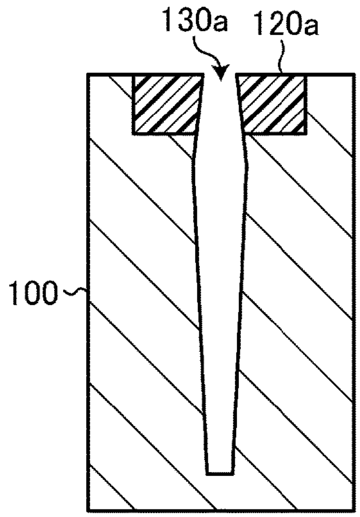
FIGS. 5A to 5F are diagrams illustrating a portion of a procedure of a method of manufacturing a semiconductor device related to Modification 2 of Embodiment 1.
Figure 5C:
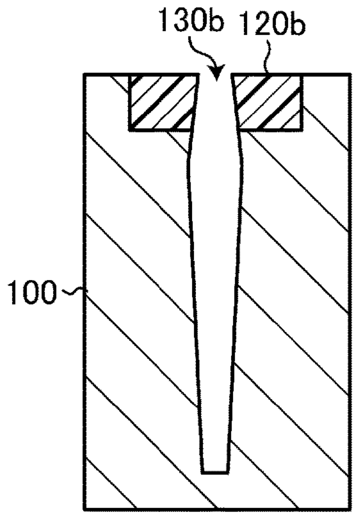
Figure 5E:
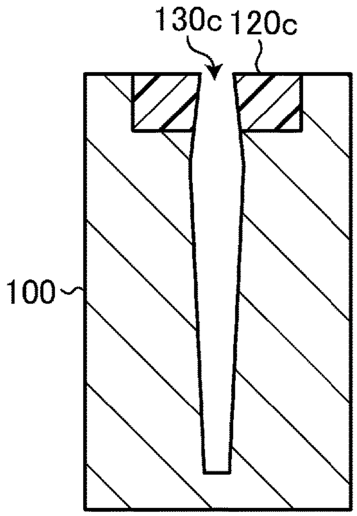
Figure 5B:
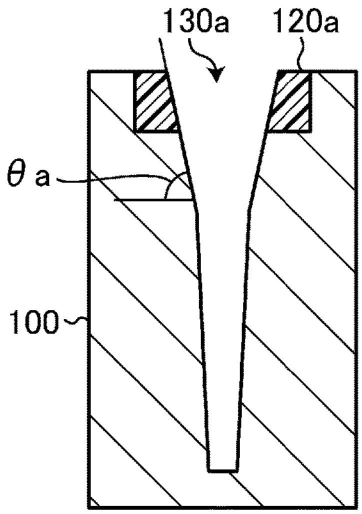

The auxiliary layer 120*a* illustrated in FIGS. 5A and 5B is, for example, LP-TEOS or P-dTEOS and has a film quality that is relatively easily etched.

FIG. 5A illustrates a process corresponding to the process of FIG. 3E. That is, FIG. 5A is a diagram illustrating the embedding target portion 130*a* formed in the layer to be processed 100 in which the auxiliary layer 120*a* is formed. In addition, FIG. 5B illustrates a process corresponding to the process of FIG. 3F. That is, FIG. 5B is a diagram illustrating that the entire upper surfaces of the auxiliary layers 120*a* and the layer to be processed 100 of FIG. 5A are etched back.

As illustrated in FIG. 5B, by using a film that is comparatively easily etched as the auxiliary layer 120*a*, the embedding target portion 130*a* having a taper angle θa is obtained.

Figure 5D:
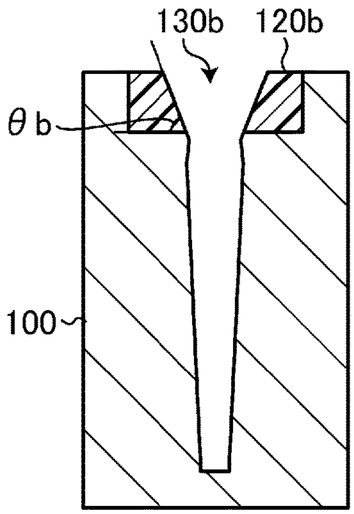

An auxiliary layer 120*b* illustrated in FIGS. 5C and 5D is, for example, P—SiN and has a film quality that is etched more difficultly than the auxiliary layer 120*a*.

FIG. 5C is a process corresponding to the process of FIG. 3E. That is, FIG. 5C is a diagram illustrating that an embedding target portion 130*b* is formed on the layer to be processed 100 on which the auxiliary layer 120*b* is formed. In addition, FIG. 5D is a process corresponding to the process of FIG. 3F. That is, FIG. 5D is a diagram illustrating that the entire upper surfaces of the auxiliary layer 120*b* and the layer to be processed 100 of FIG. 5C are etched back.

As illustrated in FIG. 5D, by using a film that is etched more difficultly than the auxiliary layer 120*a* as the auxiliary layer 120*b*, the embedding target portion 130*b* having a taper angle θb smaller than the taper angle θa is obtained.

Figure 5F:
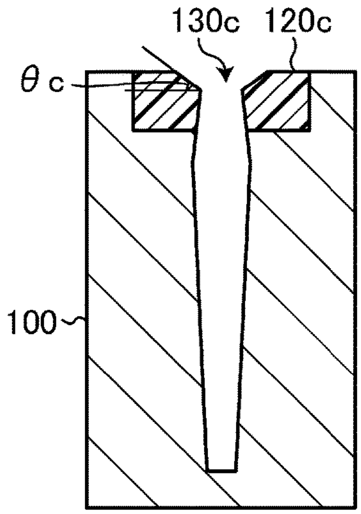

An auxiliary layer 120*c* illustrated in FIGS. 5E and 5F is, for example, Poly-Si and has a film quality that is etched much more difficultly than the auxiliary layer 120*a* and the auxiliary layer 120*b*.

FIG. 5E is a process corresponding to the process of FIG. 3E. That is, FIG. 5E is a diagram illustrating that an embedding target portion 130*c* is formed on the layer to be processed 100 on which the auxiliary layer 120*c* is formed. In addition, FIG. 5F is a process corresponding to the process of FIG. 3F. That is, FIG. 5E is a diagram illustrating that the entire upper surfaces of the auxiliary layer 120*c* and the layer to be processed 100 of FIG. 5F are etched back.

By using a film that is etched much more difficultly than the auxiliary layer 120*b* as the auxiliary layer 120*c*, the embedding target portion 130*c* having a taper angle θc smaller than the taper angle θb is obtained.

That is, at this time, a following relationship provided below is satisfied between the taper angles θa to θc.

$$\theta a>\theta b>\theta c$$

In this manner, the taper angles θa to θc, that is expansion statuses of the upper ends of the embedding target portions 130*a* to 130*c* when being etched back by using different types of films as the auxiliary layers 120*a* to 120*c* may be changed. Accordingly, it is possible to easily embed a predetermined film to embedding target portions having different depths and widths with the embedding failure prevented.

According to the semiconductor device of Modification 2, the same effect as in the method of manufacturing the semiconductor device 1 according to Embodiment 1 as described above is exhibited.

In addition, the auxiliary layers 120*a* to 120*c* illustrated in FIGS. 5A, 5C, and 5E is obtained by forming recesses (not illustrated) to fill the auxiliary layers 120*a* to 120*c* in the upper surface of the layer to be processed 100 and sequentially forming the auxiliary layers 120*a* to 120*c* of different types while sequentially protecting other recesses except for the recesses to be the formation targets of any of the auxiliary layers 120*a* to 120*c* among these recesses with resist layers or the like.

Otherwise, the recesses (not illustrated) for filling the auxiliary layers 120*a* to 120*c* illustrated in FIGS. 5A, 5C, and 5E may not be formed in the upper surface of the layer to be processed 100 in advance but may be formed independently whenever forming each of the auxiliary layers 120*a* to 120*c*.

In this case, since it is not necessary to protect other recesses except for the recesses to be formation targets of any of the auxiliary layers 120*a* to 120*c* with the resist layers or the like, a step that depends on the thickness of the resist layer or the like is not formed at the boundary between the region in which the recess is formed and the region that is protected by the resist layer or the like.

If such a step is formed, etching ions cannot reach a lower portion of the step, and film residues are formed in the auxiliary layers 120*a* to 120*c* to cause dust in subsequent steps.

By independently forming the recesses (not illustrated) to be filled with the auxiliary layers 120*a* to 120*c* whenever forming each of the auxiliary layers 120*a* to 120*c*, it is possible to prevent generation of film residues and dusts as described above.

Further, even when layers of the same kind are used, the auxiliary layers 120*a* to 120*c* having different etching resistances may be formed, for example, by changing the film deposition temperature. For example, even P-dTEOS, which is relatively easily etched, the layer becomes denser by raising the film deposition temperature, so that a film quality that is difficultly to be etched can be obtained.

(Modification 3)

Next, the semiconductor device according to Modification 3 of Embodiment 1 is described with reference to FIGS. 6A to 6F. The semiconductor device according to Modification 2 is different from Embodiment 1 described above in that the auxiliary layers 120*a*, 120*d*, and 120*e* having different widths and depths are used for each configuration to be the application target of the method according to Modification 3 such as the plurality of contacts CC, the plurality of columnar portions HR, and the plate-shaped contacts LI.

FIGS. 6A to 6F are diagrams illustrating a portion of a procedure of the method of manufacturing the semiconductor device related to Modification 3 of Embodiment 1.

Also, in the description of FIGS. 6A to 6F, all the auxiliary layers 120*a*, 120*d*, and 120*e* are layers of the same type and same quality, and, for example, LP-TEOS is used.

Figure 6A:
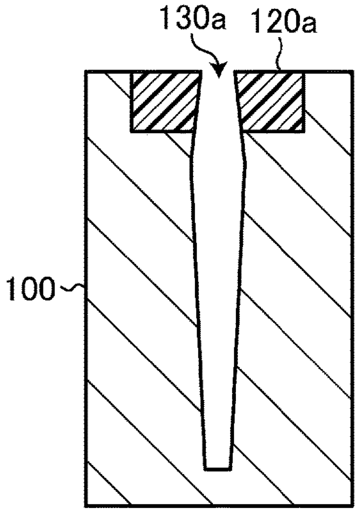
FIGS. 6A to 6F are diagrams illustrating a portion of a procedure of a method of manufacturing a semiconductor device related to Modification 3 of Embodiment 1.
Figure 6C:
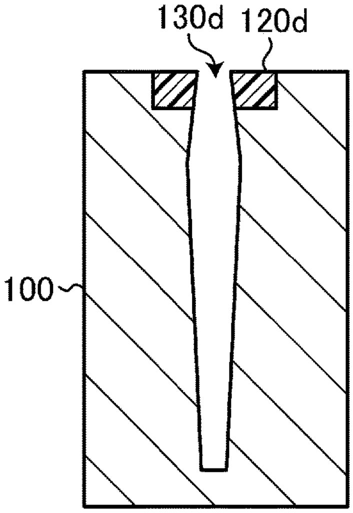
Figure 6E:
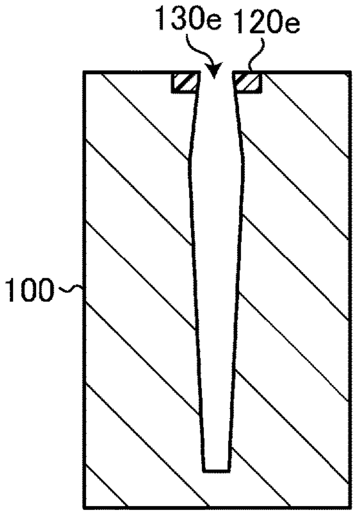
Figure 6B:
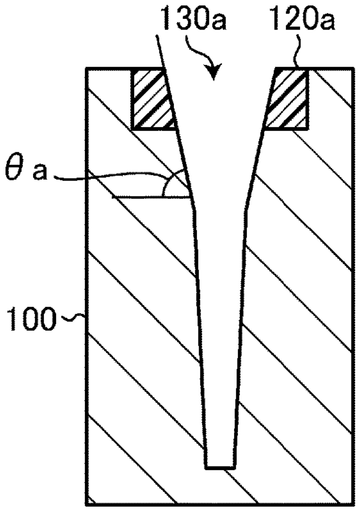

FIGS. 6A and 6B illustrate an example of a case where at least any one of the width and the depth of the auxiliary layer 120*a* is large.

FIG. 6A is a process corresponding to the process of FIG. 3E. That is, FIG. 6A is a diagram illustrating that the embedding target portion 130*a* is formed on the layer to be processed 100 in which the auxiliary layer 120*a* having a large width and depth is formed. In addition, FIG. 6B is a process corresponding to the process of FIG. 3F. That is, FIG. 6B is a diagram illustrating that the auxiliary layer 120*a* and the layer to be processed 100 of FIG. 6A are used as process targets and etched back.

As illustrated in FIG. 6B, by using the auxiliary layer 120*a* having a large width and depth, it is possible to obtain the embedding target portion 130*a* having the predetermined taper angle θa.

Figure 6D:
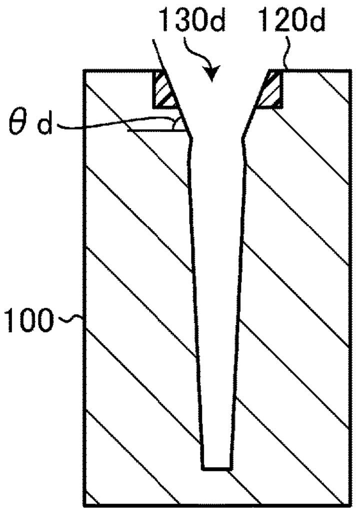

FIGS. 6C and 6D illustrate an example of a case where at least any of the width and the depth of an auxiliary layer 120*d* is smaller than that in the example of FIG. 6A.

FIG. 6C is a process corresponding to the process of FIG. 3E. That is, FIG. 6C is a diagram, for example, illustrating that an embedding target portion 130*d* is formed in the layer to be processed 100 in which the auxiliary layer 120*d* having an intermediate width and depth is formed. In addition, FIG. 6D is a process corresponding to the process of FIG. 3F. That is, FIG. 6D is a diagram illustrating that the entire upper surfaces of the auxiliary layer 120*d* and the layer to be processed 100 of FIG. 6C are etched back.

As illustrated in FIG. 6D, by using the auxiliary layer 120*d* having a smaller width and depth than those in a case of FIGS. 6A and 6B, the embedding target portion 130*d* having a taper angle θd smaller than the taper angle θa is obtained.

Figure 6F:
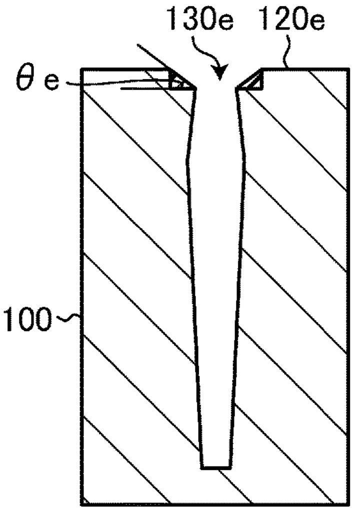

FIGS. 6E and 6F illustrate an example of a case where at least any of the width and the depth of an auxiliary layer 120*e* is smaller than the example of FIGS. 6C and 6D.

FIG. 6E is a process corresponding to the process of FIG. 3E. That is, FIG. 6E is a diagram illustrating that an embedding target portion 130*e* is formed, for example, in the layer to be processed 100 in which the auxiliary layer 120*e* having a small width and depth is formed. Also, FIG. 6F is a process corresponding to the process of FIG. 3F. That is, FIG. 6F is a diagram illustrating that the entire upper surfaces of the auxiliary layer 120*e* and the layer to be processed 100 of FIG. 6E are etched back.

As illustrated in FIG. 6F, by using the auxiliary layer 120*e* having a much smaller width and depth, the embedding target portion 130*e* having a taper angle θe smaller than the taper angle θd is obtained.

That is, at this time, a following relationship is satisfied between the taper angles θa, θd, and θe.

$$\theta a>\theta d>\theta e$$

In this manner, by using the auxiliary layers 120*a*, 120*d*, and 120*e* having different widths and depths, the taper angles θa, θd, and θe at the time of being etched back, that is, the expansion statuses of the upper ends of the embedding target portions 130*a*, 130*d*, and 130*e* may be changed. Accordingly, the predetermined films can be easily embedded to the embedding target portions in a tapered shape having different depths and widths at an upper end portion with embedding failure prevented.

In addition, the auxiliary layers 120*a*, 120*d*, and 120*e* illustrated in FIGS. 6A, 6C, and 6E are obtained by collectively filling the recesses obtained by independently performing the processes illustrated in FIGS. 3A and 3B as described above with the auxiliary layers 120*a*, 120*d*, and 120*e* in the regions in which the auxiliary layers 120*a*, 120*d*, and 120*e* are formed. At this time, the auxiliary layers 120*a*, 120*d*, and 120*e* may be formed by varying at least any of exposure conditions, etching conditions, and cleaning conditions of the resist patterns in each region in which the auxiliary layers 120*a*, 120*d*, and 120*e* are formed.

That is, for example, by changing the exposure dose and the depth of focus during formation of the resist pattern, the size of the resist pattern opening is changed so that the shape of the recess may be adjusted.

Further, for example, when performing the recess etching process, the shape of the recess may be adjusted by increasing or decreasing a side wall protecting layer deposited on the processing surface of the layer to be processed 100 that is the process target, that is, the deposition amount of the by-product by the plasma reaction. For example, if the side wall protecting layer becomes thick, the shape of the recess becomes the tapered shape, and if the side wall protecting layer is thin, the shape of the recess becomes a straight shape or a bowing shape.

In addition, for example, after the completion of etching and asking the layer to be processed 100, dilute hydrogen fluoride (DHF) or buffered hydrogen fluoride (BHF) washing is performed, the shape of the recess may be adjusted by the processing time. For example, if the processing time is extended, the recess expands horizontally, and if the processing time is shortened, the expansion of the recess can be reduced.

Embodiment 2

Embodiment 2 is described in detail below with reference to the drawings. Embodiment 2 is different from Embodiment 1 described above in that an auxiliary layer is formed by etching back, instead of the CMP.

FIGS. 7A to 7F and 8A to 8D are diagrams sequentially illustrating a portion of a procedure of the method of manufacturing the semiconductor device 1 related to Embodiment 2. In addition, in FIGS. 7A to 7F and 8A to 8D, the same configurations as in Embodiment 1 described above are denoted by the same reference numerals, and the description thereof is omitted.

FIGS. 7A to 7C and 8A and 8B and FIGS. 7D to 7F and 8C and 8D sequentially illustrate examples of cases where the embedding target portions 130*a* and 130*f* having the different taper angles of the upper end portions are formed. Here, for example, FIGS. 7A to 7C and 8A and 8B illustrate a step of manufacturing the embedding target portion 130*a* formed at a position C on the layer to be processed 100, and FIGS. 7D to 7F and 8C and 8D illustrate a step of manufacturing the embedding target portion 130*f* formed at a position D on the layer to be processed 100.

First, the procedure illustrated in FIGS. 7A to 7C and 8A and 8B is described.

Figure 7A:
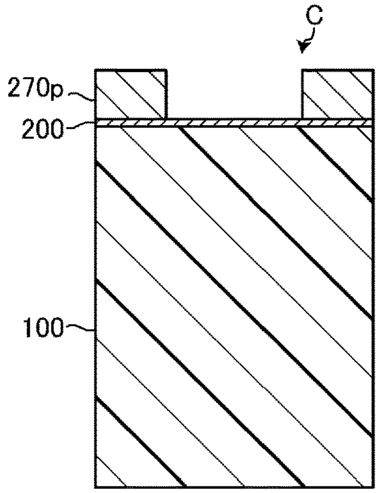
FIGS. 7A to 7F are diagrams sequentially illustrating a portion of a procedure of a method of manufacturing a semiconductor device related to Embodiment 2.

As illustrated in FIG. 7A, the BARC layer 200 and the resist layer (not illustrated) are formed on the upper surface of the layer to be processed 100, and the resist pattern 270*p* is formed at the position C by performing the exposure and development process. By performing etching and asking by using the layer to be processed 100 as the process target, a recess 110*h* illustrated in FIG. 7B is formed.

Figure 7D:
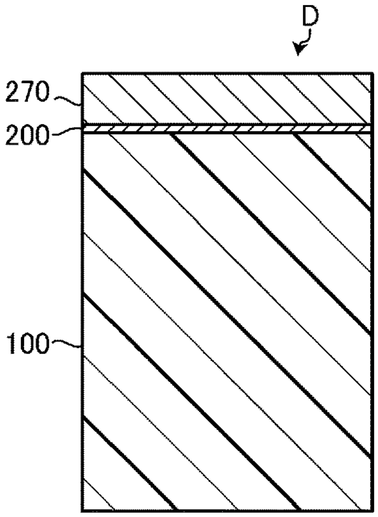
Figure 7B:
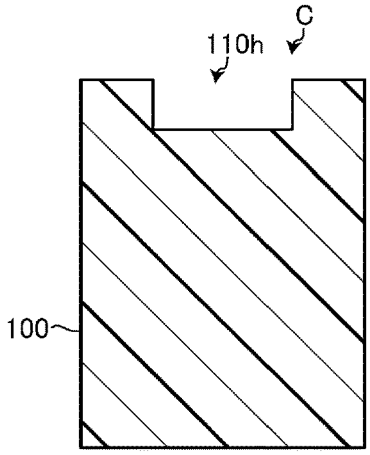
Figure 7E:
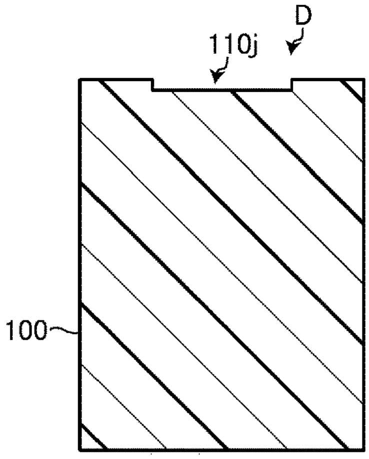
Figure 7C:
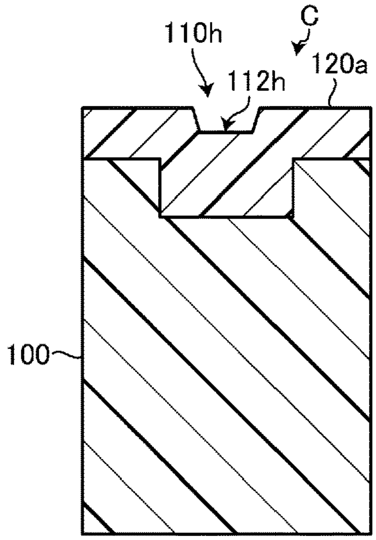

As illustrated in FIG. 7C, the auxiliary layer 120*a* is formed in a predetermined thickness so that the entire upper surface of the layer to be processed 100 in which the recess 110*h* is formed is covered.

At this time, by forming the auxiliary layers 120*a*, for example, by a CVD method, the auxiliary layer 120*a* is formed in a substantially uniform thickness along the bottom surface and side walls of the recess 110*h* and the upper surface of the layer to be processed 100. Therefore, a new recess 112*h* having a size corresponding to the shape of the recess 110*h* is formed in the recess 110*h* on the front surface of the auxiliary layer 120*a*. That is, the width and depth of the recess 112*h* is different from the width and the depth of the recess 110*h* and the thickness of the auxiliary layer 120*a*. For example, if the recess 110*h* of the layer to be processed 100 is shallow, the width and depth of the recess 112*h* on the front surface of the auxiliary layer 120*c* becomes small, and if the recess 110*h* of the layer to be processed 100 is deep, the width and depth of the recess 112*h* on the front surface of the auxiliary layer 120*a* becomes large. In addition, for example, if the thickness of the auxiliary layer 120*a* is thick, the width and depth of the recess 112*h* becomes small, and if the thickness of the auxiliary layer 120*a* is thin, the width and depth of the recess 112*h* becomes large.

After forming the auxiliary layer 120*a* having the recess 112*h* on the front surface, the entire upper surface of the auxiliary layer 120*a* is etched back by using the auxiliary layer 120*a* as the process target.

Figure 8A:
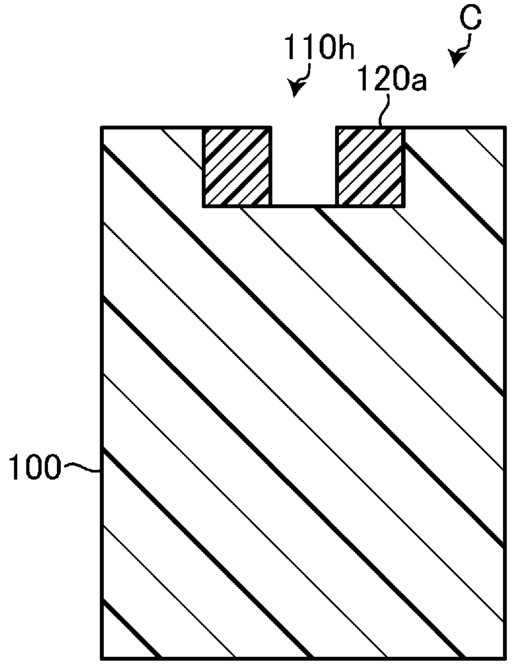
FIGS. 8A to 8D are diagrams sequentially illustrating a portion of a procedure of the method of manufacturing the semiconductor device related to Embodiment 2.

Than, as illustrated in FIG. 8A, the auxiliary layer 120*a* remains on the side wall of the recess 110*h* of the layer to be processed 100, and a portion of the layer to be processed 100 is exposed on the bottom surface of the recess 110*h*. Ions incident substantially perpendicularly downward advance etching in the vertical direction rather than in the horizontal direction, and thus the auxiliary layer 120*a* formed on the upper surface of the layer to be processed 100 and the bottom surface of the recess 110*h* are preferentially removed.

Figure 8B:
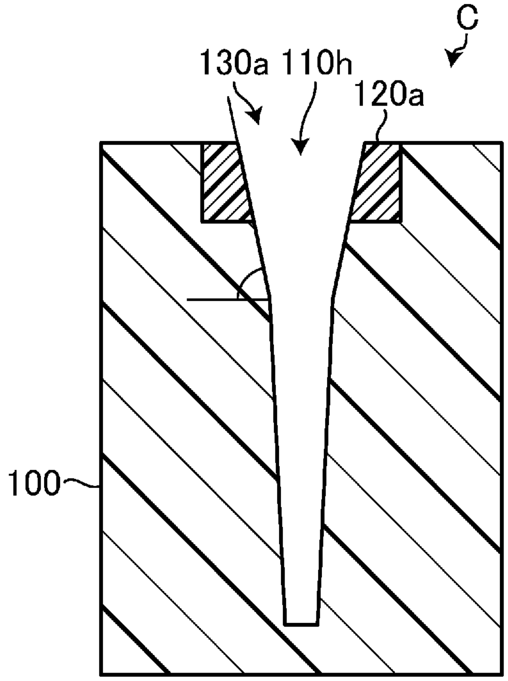

Next, the layer to be processed 100 is etched back as the process target. Then, a portion in which the layer to be processed 100 is exposed in the recess 110*h* is gradually removed by etching in the depth direction of the layer to be processed 100. At this time, the auxiliary layer 120*a* remaining on the side wall of the recess 110*h* plays a role of a mask, and an etching shape such as a hole shape or a groove shape is obtained according to the shape of the recess 110*h* formed on the layer to be processed 100 in the layer to be processed 100. However, as described above, a material having a low etching resistance is used for the auxiliary layer 120*a*. Therefore, as etching advances in the depth direction of the layer to be processed 100, a portion in the auxiliary layer 120*a* remaining on the side wall of the recess 110*h* is etched, and the embedding target portion 130*a* in which the upper end portion is enlarged in the XY direction is formed as illustrated in FIG. 8B.

Next, the procedure of FIGS. 7D to 7F and 8C and 8D is described.

As illustrated in FIG. 7D, while the process illustrated in FIGS. 7A and 7B is performed at the position C, the exposure and development process of a resist layer 270 is not performed at the position D, and the position D is kept being covered with the BARC layer 200 and the resist layer 270. Next, after the completion of the process illustrated in FIGS. 7A and 7B at the position C, ashing is once performed.

Next, a BARC layer and a resist layer (not illustrated) are formed on the upper surface of the layer to be processed 100 again, and a resist pattern (not illustrated) is formed at the position D by performing the exposure and development process. Also at this point, the position C is kept being covered with the BARC layer and the resist layer (not illustrated). By performing etching and ashing by using the layer to be processed 100 as the process target, a recess 110*j* as illustrated in FIG. 7E is formed.

Figure 7F:
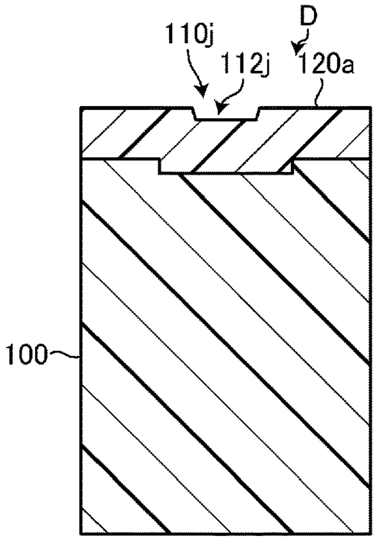

As illustrated in FIG. 7F, while the process illustrated in FIG. 7C is performed at the position C, also at the position D, the auxiliary layer 120*a* is formed so as to be covered with the entire upper surface of the layer to be processed 100 in which the recess 110*j* is formed.

At this time, a new recess 112*j* having a size corresponding to the shape of the recess 110*h* is formed in the recess 110*j*. Therefore, the depth of the recess 112*j* is shallower than the depth of the recess 112*h* formed in FIG. 7C.

The entire upper surface of the auxiliary layer 120*c* is etched back by using the auxiliary layer 120*c* as the process target.

Figure 8C:
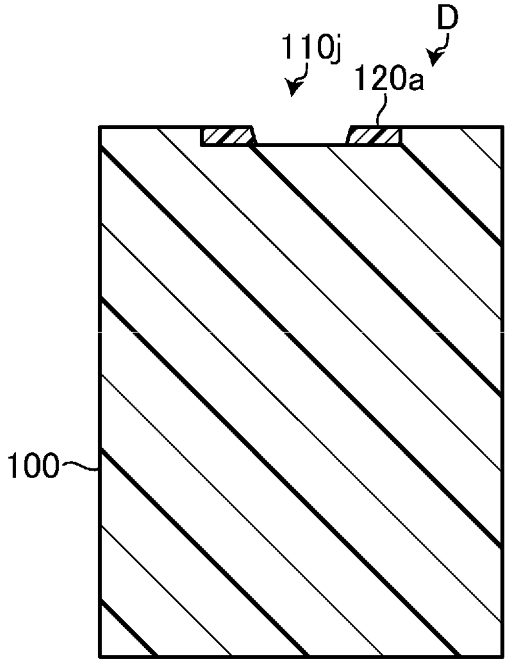

Then, as illustrated in FIG. 8C, the auxiliary layer 120*a* is remained on the side wall of the recess 110*j* of the layer to be processed 100, and a portion of the layer to be processed 100 is exposed on the bottom surface of the recess 110*j*. Also, at this time, since the depths of the recesses 110*h* and 110*j* are different from each other, the auxiliary layer 120*a* of FIG. 8C is thinner than the auxiliary layer 120*a* of FIG. 8A.

Figure 8D:
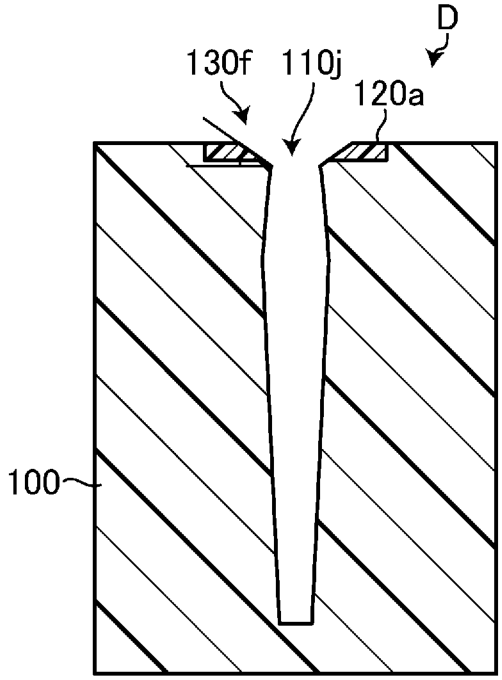

Next, the layer to be processed 100 is used as the process target and etched back. Then, the embedding target portion 130*f* in which the upper end portion is enlarged in the XY direction is formed as illustrated in FIG. 8D. At this time, the taper angle of the embedding target portion 130*f* of FIG. 8D is smaller than that of the embedding target portion 130*a* of FIG. 8B.

In this manner, the embedding target portions having different taper angles can be formed on the same layer to be processed 100.

In the method of manufacturing the semiconductor device according to Embodiment 2, by providing the recesses 110*h* and 110*j* of different types on the same layer to be processed 100, the auxiliary layers 120*a* having different widths and depths can be formed. Accordingly, it is possible to fill the embedding target portions of different types with the predetermined film at once, while the embedding failure is prevented.

In the method of manufacturing the semiconductor device according to Embodiment 2, the same effect as the method of manufacturing the semiconductor device 1 of Embodiment 1 described above is exhibited.

Embodiment 3

Hereinafter, Embodiment 3 is described in detail below with reference to the drawings. Embodiment 3 is different from Embodiment 1 described above in that the auxiliary layer is removed by a wet process.

FIGS. 9A to 9D and 10A to 10D are diagrams illustrating a portion of the procedure of the method of manufacturing the semiconductor device 1 related to Embodiment 3. Also, in FIGS. 9A to 9D and 10A to 10D, the same configuration as in Embodiment 1 described above are denoted by the same reference numerals, and the description is omitted.

FIGS. 9A and 9B and 10A and 10B and FIGS. 9C and 9D and 10C and 10D sequentially illustrate examples of cases where embedding target portions 130*g* and 130*h* of different types are formed. Here, for example, FIGS. 9A and 9B and 10A and 10B illustrate a step of manufacturing the embedding target portion 130*g* formed at a position E on the layer to be processed 100, and FIGS. 9C and 9D and 10C and 10D illustrate a step of manufacturing the embedding target portion 130*h* at a position F on the layer to be processed 100.

First, the procedure of FIGS. 9A and 9B and 10A and 10B is described.

Figure 9A:
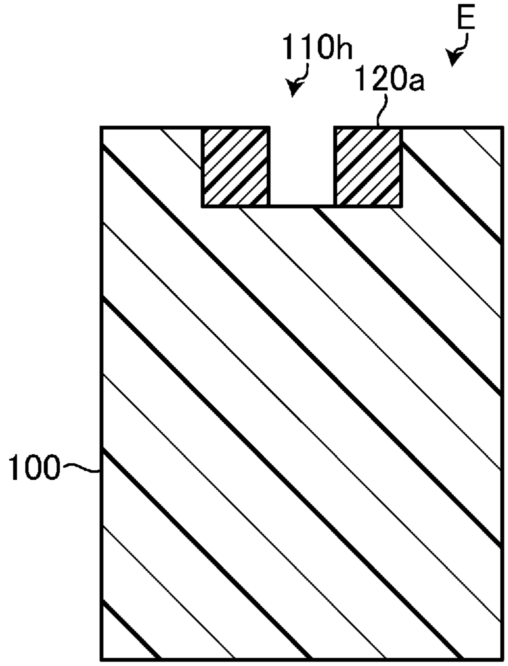
FIGS. 9A to 9D are diagrams sequentially illustrating a portion of a procedure of a method of manufacturing a semiconductor device related to Embodiment 3.

FIG. 9A is a diagram corresponding to FIG. 8A. That is, prior to the process of FIG. 9A, the process of Embodiment 2 illustrated in FIGS. 7A to 7C described above is performed.

As illustrated in FIG. 9A, the recess 110*h* is formed on the upper surface of the layer to be processed 100, the auxiliary layer 120*c* remains on the side wall of the recess 110*h*, and a portion of the layer to be processed 100 is exposed on the bottom surface of the recess 110*h*.

A spin on carbon (SOC) layer 230 covers the entire upper surface of the layer to be processed 100. The SOC layer 230 is an organic layer formed by the spin coating method. Next, a spin on glass (SOG) layer 250 that covers the SOC layer 230 is formed. The SOG layer 250 is a silicon oxide layer formed by the spin coating method. Also, by forming the resist layer that covers the SOG layer 250, the resist pattern 270*p* is formed by performing the exposure and development process. Accordingly, a three-layer resist structure to be a mask at the time of processing the layer to be processed 100 is formed.

Figure 10A:
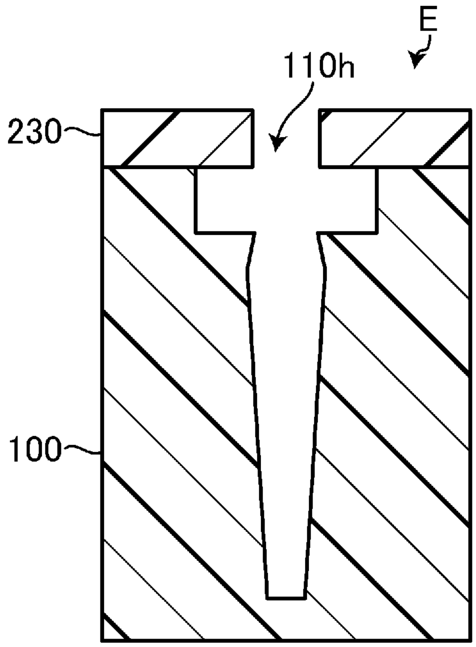
FIGS. 10A to 10D are diagrams sequentially illustrating a portion of the procedure of the method of manufacturing the semiconductor device related to Embodiment 3.

In FIG. 10A, the SOG layer 250 is removed by using the resist pattern 270*p* as the mask, the SOC layer 230 is removed by using the SOG layer 250 as the mask, and the layer to be processed 100 is etched by further using the SOC layer 230 as the mask. Accordingly, the embedding target portion 130*g* is formed.

Next, by using the auxiliary layer 120*a* in which the embedding target portion 130*g* is formed as the process target, a chemical treatment using a treatment liquid such as hydrofluoric acid is performed. Accordingly, the auxiliary layer 120*a* is dissolved by the treatment liquid and removed.

Figure 10C:
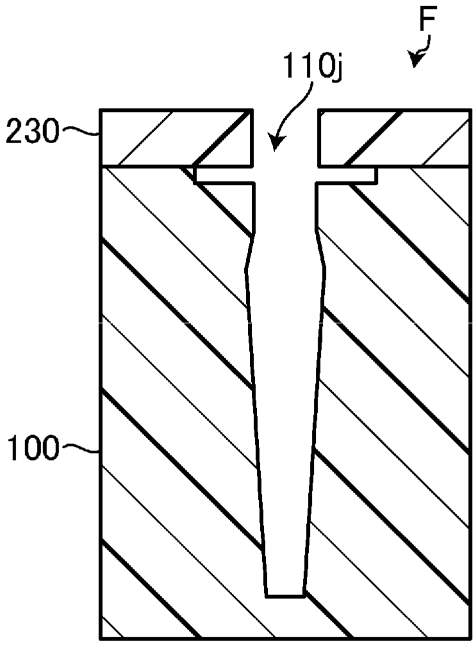
Figure 10B:
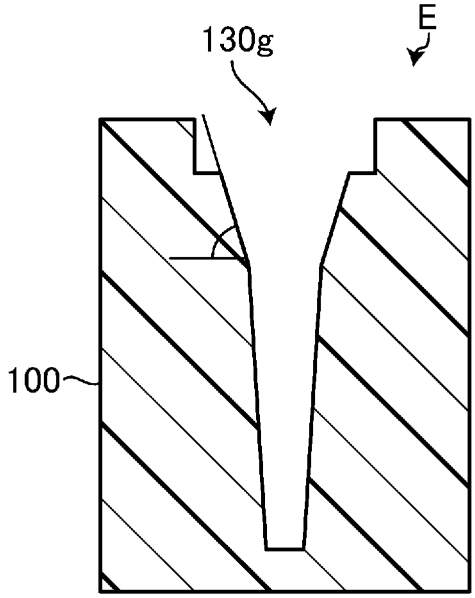

In FIG. 10B, the SOC layer 230 is removed by asking. Accordingly, the recess 110*h* is exposed in the upper portion of the embedding target portion 130*g*. Also, the layer to be processed 100 is etched back from the upper surface of the recess 110*h*. Then, a portion in the recess 110*h* is etched, so that the embedding target portion 130*g* of which the upper end portion is enlarged in the XY direction is formed.

Next, the procedures of FIGS. 9C and 9D and 10C and 10D are described.

Figure 9B:
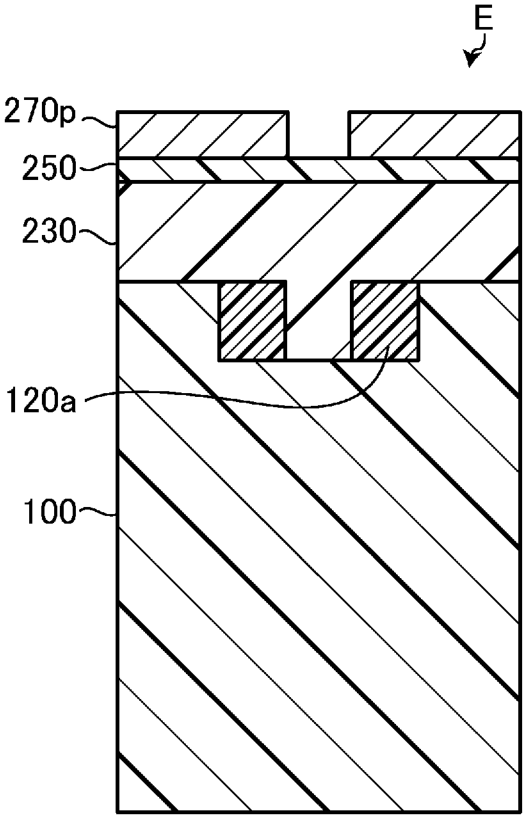
Figure 9C:
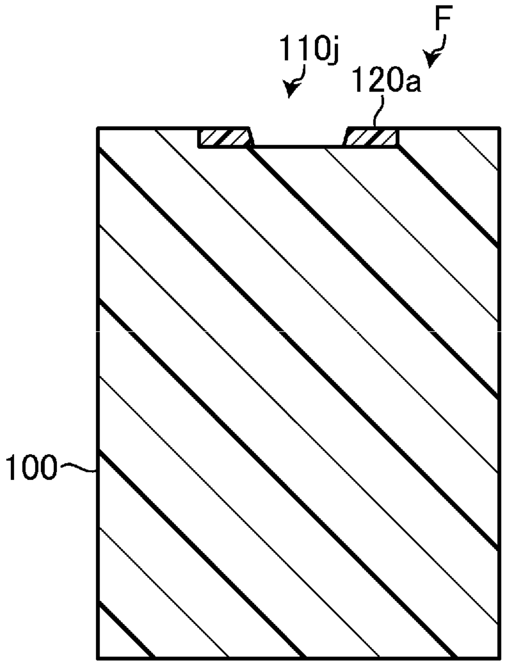

FIG. 9C is a diagram corresponding to FIG. 8C. That is, prior to the process of FIG. 9C, the process of FIGS. 7D to 7F according to Embodiment 2 described above is performed.

As illustrated in FIG. 9C, the recess 110*j* is formed on the upper surface of the layer to be processed 100, the auxiliary layer 120*a* remains on the side wall of the recess 110*j*, and a portion of the layer to be processed 100 is exposed on the bottom surface of the recess 110*j*. In addition, as described with reference to FIGS. 8A and 8C described above, the thickness of the auxiliary layer 120*c* illustrated in FIG. 9C is thinner than the thickness of the auxiliary layer 120*a* of FIG. 9A.

Figure 9D:
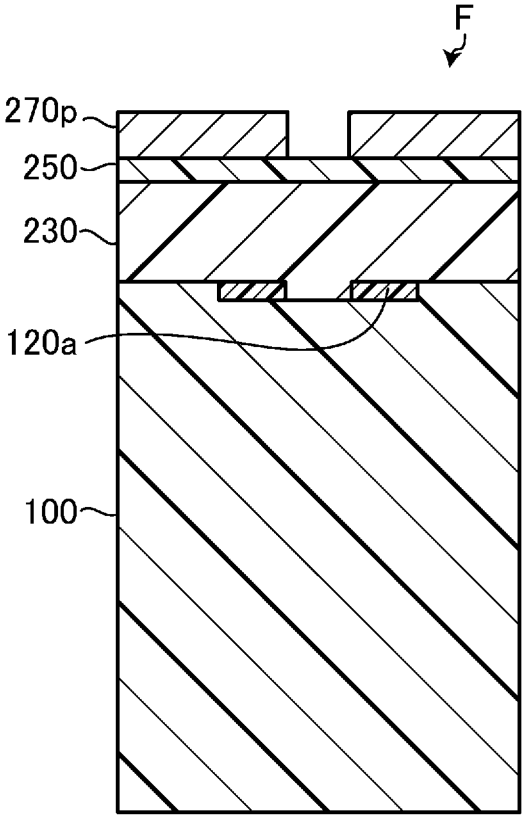

In FIG. 9D, each layer that configures the three-layer resist structure described above is formed on the upper surface of the layer to be processed 100 in parallel to FIG. 9B described above.

In FIG. 10C, in parallel to FIG. 10A described above, the SOG layer 250 is removed by using the resist pattern 270*p* as the mask, the SOC layer 230 is removed by using the SOG layer 250 as the mask, and the layer to be processed

100 is etched by further using the SOC layer 230 as the mask. Accordingly, the embedding target portion 130*h* is formed.

The auxiliary layer 120*a* is removed by performing a chemical treatment using hydrofluoric acid or the like.

Figure 10D:
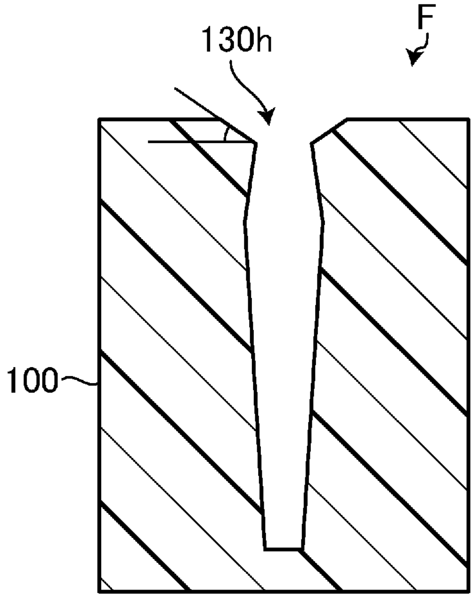

In FIG. 10D, the SOC layer 230 is removed by asking. Accordingly, the recess 110*j* is exposed on the upper portion of the embedding target portion 130*h*. Also, the layer to be processed 100 is etched back from the upper surface of the recess 110*j*. Then, a portion in the recess 110*j* is etched, and the embedding target portion 130*h* of which the upper end portion is enlarged in the XY direction is formed. At this time, the taper angle of the embedding target portion 130*h* of FIG. 10D is smaller than the embedding target portion 130*g* of FIG. 10B.

In addition, in Embodiment 3 described above, in order to form the resist pattern 270*p*, the stacked structure of the SOC layer 230 and the SOG layer 250 is used, but the present disclosure is not limited thereto. That is, a stacked film of a carbon film, an SiCN film, and the like formed by the CVD method may be formed on the lower layer of the resist pattern 270*p*.

According to the method of manufacturing the semiconductor device of Embodiment 3, after forming the embedding target portions 130*g* and 130*h*, the auxiliary layer 120*a* is removed, and the recesses 110*h* and 110*j* are exposed. If the layer to be processed 100 is etched back from the upper surfaces of the exposed recesses 110*h* and 110*j*, a portion in the recesses 110*h* and 110*j* is etched, and the embedding target portion of which the upper end portion expands in the XY direction is formed. Accordingly, the embedding failure is prevented, and it is possible to easily fill the predetermined film.

In the method of manufacturing the semiconductor device according to Embodiment 3, the same effect as the method of manufacturing the semiconductor device 1 according to Embodiment 1 described above is exhibited.

In Embodiments 1 and 2 and the modifications thereof described above, the BARC layer 200 is used for forming the resist pattern 270*p*. However, the present disclosure is not limited thereto. In Embodiments 1 and 2 described above, for example, the three-layer resist structure according to Embodiment 3 may be used as a mask. Also, at this time, a carbon film and an SiCN film formed by the CVD method may be provided on the lower layer of the resist pattern 270*p*.

In Embodiments 1 to 3 and the modifications thereof described above, the formation targets of the auxiliary layer 120*a* are described by using the plate-shaped contact LI, the contact CC, the columnar portion HR, and the element dividing section DS. However, the present disclosure is not limited thereto. The configurations of these embodiments can be applied to a groove that prevents an inflow of a removing liquid of the insulating layer to the through contact region TP when the through contact region TP is interposed from the both sides in the Y direction, and then the word lines WL are formed in the stacked body.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:

a stacked body having a plurality of conductive layers and a plurality of first insulating layers alternately stacked, the stacked body having a step portion obtained by processing the plurality of conductive layers in a step shape;

a second insulating layer covering the step portion and including first and second recess portions on an upper surface;

a first layer filling the first recess portions;

a second layer filling the second recess portions;

a plate-shaped portion penetrating the first layer, extending in a stacking direction of the stacked body of the first insulating layer and the stacked body, and extending in a first direction intersecting the stacking direction; and a contact penetrating the second layer, extending in the stacking direction of the second insulating layer, and connected to any of the plurality of conductive layers, wherein the plate-shaped portion has a tapered shape with a width in the first direction that reduces from an upper surface of the first layer in a direction towards a lower surface, and the contact has a tapered shape with a width in the first direction that reduces from an upper surface of the second layer in a direction towards a lower surface.

2. The semiconductor device according to claim 1, wherein the semiconductor device includes a three-dimensional nonvolatile memory.

3. The semiconductor device according to claim 1, wherein the second recess portion has a groove shape.

4. The semiconductor device according to claim 1, wherein the second layer includes polysilicon.

5. The semiconductor device according to claim 1, wherein the second layer is formed by chemical vapor deposition.

6. The semiconductor device according to claim 1, wherein the plurality of conductive layers include a plurality of word lines.

7. The semiconductor device according to claim 6, wherein the word lines are formed as one of tungsten or molybdenum.

* * * * *